(12) United States Patent
Wang

(10) Patent No.: US 7,026,719 B2
(45) Date of Patent: Apr. 11, 2006

(54) SEMICONDUCTOR PACKAGE WITH A HEAT SPREADER

(75) Inventor: Sung-Fei Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/605,163

(22) Filed: Sep. 12, 2003

(65) Prior Publication Data

US 2004/0164390 A1   Aug. 26, 2004

(30) Foreign Application Priority Data

Feb. 26, 2003   (TW)   ............... 92104001 A

(51) Int. Cl.
*H01L 23/36* (2006.01)
*H01L 23/12* (2006.01)
*H01L 25/04* (2006.01)

(52) U.S. Cl. ............... 257/777; 257/686; 257/685; 257/723; 257/778; 257/734; 257/737; 257/738; 257/678; 257/673; 257/774; 257/680; 257/784; 257/712; 257/713; 257/717; 257/720; 361/707

(58) Field of Classification Search ............ 257/777, 257/786, 734, 737, 738, 723, 685, 686, 678, 257/673, 680, 774, 784, 712, 713, 717, 720; 361/707

See application file for complete search history.

(56) References Cited

U.S. PATENT DOCUMENTS

| | | | | |
|---|---|---|---|---|
| 4,750,086 | A  * | 6/1988 | Mittal | 361/689 |
| 4,835,598 | A  * | 5/1989 | Higuchi et al. | 257/668 |
| 4,896,205 | A  * | 1/1990 | Weber | 257/712 |
| 5,646,828 | A  * | 7/1997 | Degani et al. | 361/715 |
| 5,977,640 | A  * | 11/1999 | Bertin et al. | 257/777 |
| 6,144,507 | A  * | 11/2000 | Hashimoto | 359/819 |
| 6,297,551 | B1 * | 10/2001 | Dudderar et al. | 257/723 |
| 6,304,451 | B1 * | 10/2001 | Rife | 361/704 |
| 6,358,778 | B1 * | 3/2002 | Shinohara | 438/123 |
| 6,369,444 | B1 * | 4/2002 | Degani et al. | 257/724 |
| 6,414,384 | B1 * | 7/2002 | Lo et al. | 257/685 |
| 6,483,186 | B1 * | 11/2002 | Hsieh et al. | 257/707 |
| 6,507,115 | B1 * | 1/2003 | Hofstee et al. | 257/777 |
| 6,603,190 | B1 * | 8/2003 | Kosaki et al. | 257/618 |
| 6,650,009 | B1 * | 11/2003 | Her et al. | 257/686 |
| 6,693,362 | B1 * | 2/2004 | Seyama et al. | 257/777 |
| 6,734,539 | B1 * | 5/2004 | Degani et al. | 257/686 |
| 6,768,208 | B1 * | 7/2004 | Lin et al. | 257/777 |
| 6,879,031 | B1 * | 4/2005 | Wang | 257/686 |
| 2004/0042185 | A1 * | 3/2004 | Kung et al. | 361/760 |
| 2004/0080033 | A1 * | 4/2004 | Fang | 257/678 |
| 2004/0140546 | A1 * | 7/2004 | Lee et al. | 257/686 |

FOREIGN PATENT DOCUMENTS

EP   1189280 A1 *   3/2002

(Continued)

*Primary Examiner*—Alexander Oscar Williams
(74) *Attorney, Agent, or Firm*—Jianq Chyun IP Office

(57) ABSTRACT

A semiconductor package with a heat spreader is described, including a first chip, a second chip, a heat spreader and a substrate. The first chip has an active surface over which the second chip is attached. The heat spreader is attached over the first chip. The first chip is bonded onto the substrate.

8 Claims, 5 Drawing Sheets

FOREIGN PATENT DOCUMENTS

| | | | | |
|---|---|---|---|---|
| JP | 57-12561 | * | 1/1982 | ................ 257/741 |
| JP | 57-32676 | * | 2/1982 | |
| JP | 3-187227 A | * | 8/1991 | |
| JP | 6-196824 | * | 7/1994 | ................ 372/43 |
| JP | 2001-308254 | * | 11/2001 | |
| JP | 2001-352021 | * | 12/2001 | |

* cited by examiner

SEMICONDUCTOR PACKAGE WITH A HEAT SPREADER

CROSS REFERENCE TO RELATED APPLICATIONS

This application claims the priority benefit of Taiwan application serial no. 92104001, filed Feb. 26, 2003.

BACKGROUND OF INVENTION

1. Field of the Invention

The present invention relates to a multi-chip module (MCM) package with a heat spreader. More particularly, the present invention relates to a multi-chip module (MCM) package with a heat spreader efficient in heat dissipation.

2. Description of the Related Art

In the semiconductor industry, the manufacture of an IC product can be divided into two stages, including fabrication of bare IC chips and subsequent packaging processes. The bare IC chips are finished with sequential steps of wafer fabrication, circuit design, pattern transfer and wafer cutting. In the subsequent packaging processes, each bare chip is electrically connected to outer signal sources via bonding pads formed thereon, and then encapsulated with a molding material. The packaging processes are for protecting the bare chips from humidity, heat and noise from the environment, and for providing a medium of electrical connection between the bare chip and an outer circuit, such as a printed circuit board (PCB) or some package substrate.

A bare chip is usually electrically connected to a package substrate via wires. As the integration of chips is continuously increased, the multi-chip module (MCM) package is considered to be a promising technique in the future. An MCM package includes a substrate and several chips bonded thereto, wherein the chips are electrically connected to each other via the circuit on the substrate to constitute a complete circuit structure.

For example, dynamic random access memory (DRAM) chips and a central processing unit (CPU) can be bonded to a substrate to form an MCM package structure. Thus, the packaging density is increased so that less space is required, and signal delay between the chips is reduced. Therefore, MCM packages can satisfy the requirement of high performance, and are widely used in communication electronic products and portable electronic products.

FIG. 1 illustrates a cross-sectional view of a conventional multi-chip module (MCM) package. The MCM package 100 includes a substrate 110, two chips 130 and 150, a molding material 170, conductive lines 180 and 182, and solder balls 184. The substrate 110 has an upper surface 112, a lower surface 122, a die pad 114 and many contact pads 116 and 124 thereon, wherein the die pad 114 and the contact pads 116 are disposed on the upper surface 112 of the substrate 110. The contact pads 116 are disposed around the die pad 114, and the contact pads 124 are disposed on the lower surface 122 of the substrate 110.

The chip 130 has an active surface 132, a back surface 142 opposite to the active surface 132, and contact pads 134 and 136 surrounding the active surface 132 of the chip 130, wherein the contact pads 134 surround the contact pads 136. The chip 130 is adhered to the die pad 114 on the substrate 110 via an adhesive 144 on the surface 142, and is electrically connected to the substrate 110 via wires 180 bonded thereto. One end of a wire 180 is bonded to a contact pad 134 on the chip 130, and the other end is bonded to a contact pad 116 on the substrate 110.

The chip 150 has an active surface 152, a back surface 162 opposite to the active surface 152, and contact pads 154 surrounding the active surface 152. The chip 150 is adhered to the central area of the active surface 132 of the chip 130 via an adhesive 164 on the back surface 162, and is electrically connected to the chip 130 via wires 182 bonded thereto. One end of a wire 182 is bonded to a contact 154 on the chip 150, and the other end is bonded to a contact 136 on the chip 130.

In addition, the chips 130 and 150, the upper surface 112 of the substrate 110 and the wires 180 and 182 are encapsulated with a molding material 170, and solder balls 184 are disposed on the contact pads 124 of the substrate 110.

As mentioned above, the chip 130 and the substrate 110 are electrically connected via wires 180, and the two chips 130 and 150 are electrically connected via wires 182 in a conventional MCM package 100. However, since the wires 180 and 182 are long and have small cross-sectional areas, the transmitted signals will decay rapidly, and will be delayed as well. Moreover, the parasitic LC effect will occur during the operation of a high-frequency circuit to cause signal reflection. Therefore, using wires (180/182) as a medium of signal transmission causes severe noise interference and worse electrical properties.

Moreover, as the chips 130 and 150 are operated under high frequency, the temperatures thereof gradually raise because lots of heat is caused by dielectric loss. As the temperature exceeds the upper limit for normal operation of the chip, the inner circuit of the chip functions abnormally or even fails. The heat dissipation of a conventional MCM package 100 is simply achieved via the thermal conduction effect of the molding material 170 and the substrate 110. Unfortunately, the thermal conduction coefficients of the two are so small that the heat from the chips 130 and 150 cannot be dissipated efficiently, and the chips easily function abnormally or even fail.

SUMMARY OF INVENTION

In view of the forgoing, this invention provides an MCM package with a heat spreader to improve the efficiency of heat dissipation of the chips in the package.

It should be noted in advance that the use of the preposition "on" in this invention is not restricted to the cases where two objects contact with each other. For example, the expression "A is on B" means that A is disposed over and contacts with B, or that A is disposed over B without contact between them.

The semiconductor package with a heat spreader of this invention includes a first chip, a second chip, a heat spreader and a substrate. The first chip has an active surface over which the second chip is attached. The heat spreader is attached over the first chip. The first chip is bonded onto the substrate.

In a preferred embodiment of this invention, the substrate has an opening, which is passing through the substrate, for adapting the heat spreader and the second chip. Otherwise, the opening does not pass through the substrate, alternatively as a cavity, and the substrate has at least one thermo-via therein. The thermo-via passes through the substrate, and has one end exposed in the cavity of the substrate thermally connected with the heat spreader. In addition, the opening of the substrate may be filled with a filling material.

Moreover, the heat spreader may be disposed on the active surface of the first chip, or on the back surface opposite to the active surface. The first chip can be bonded with the second chip, the substrate and the heat spreader through bumps, or the first and the second chips may be bonded to the substrate through wire bonding.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
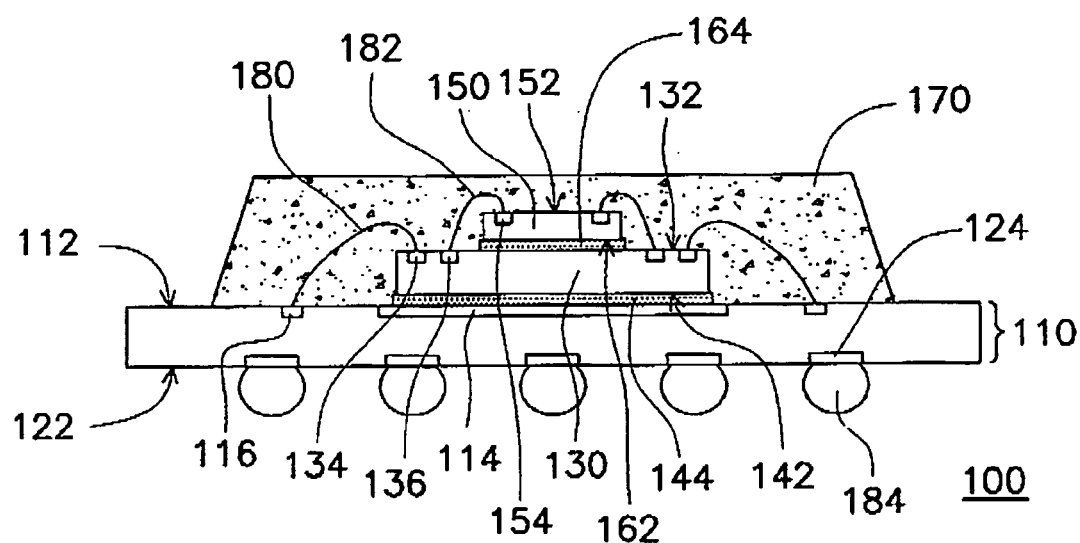
FIG. 1 illustrates a cross-sectional view of a conventional MCM package.
Figure 2:
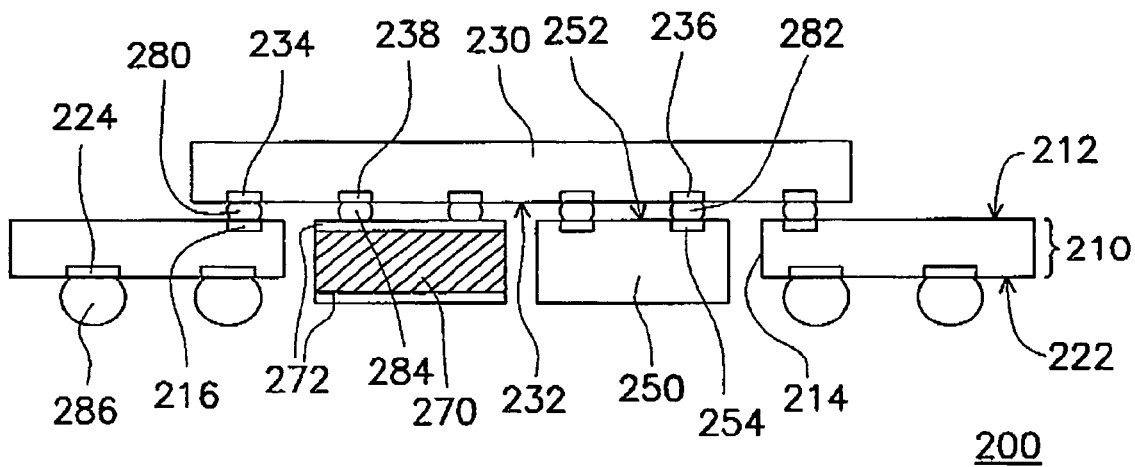
FIG. 2 illustrates a cross-sectional view of an MCM package with a heat spreader according to a first embodiment of this invention.
Figure 3:
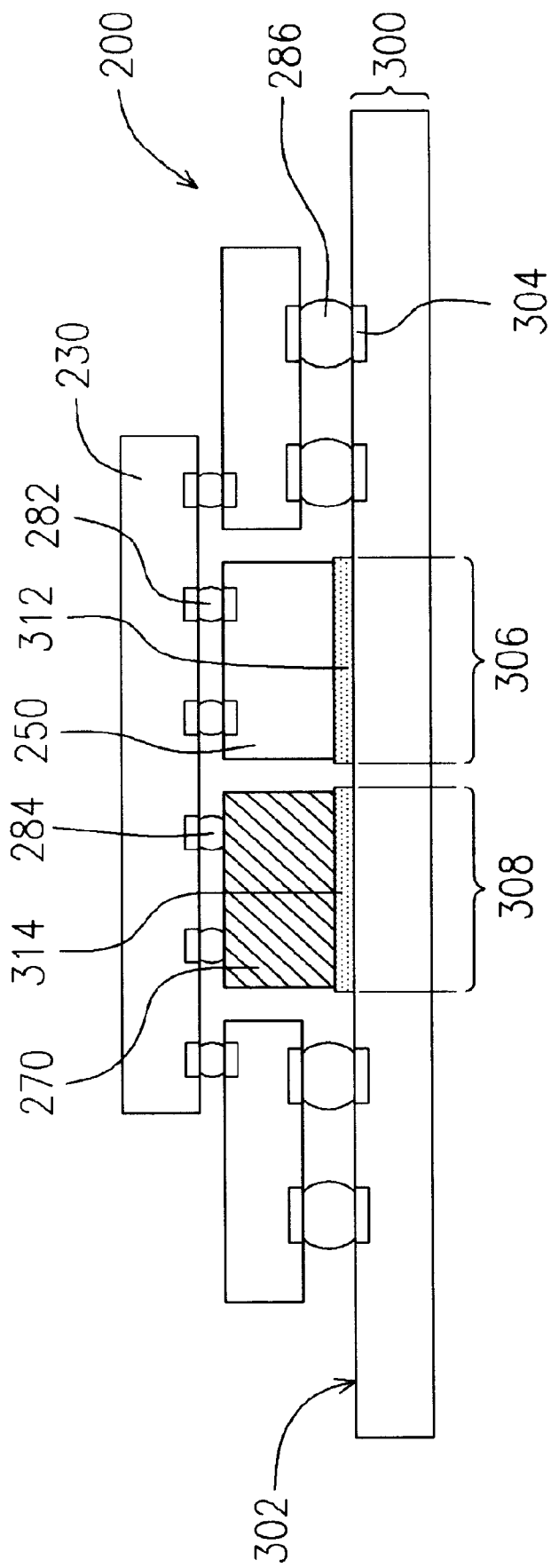
FIG. 3 illustrates an MCM package with a heat spreader mounted on a motherboard according to the first embodiment of this invention in a cross-sectional view.

The heat spreader 270 is disposed on the active surface 232 of the chip 230 and disposed in the opening 214 of the substrate 210, and is bonded to the chip 230 through the bumps 284, each of which connects a contact 238 of the chip 230 and the heat spreader 270. The heat spreader 270 also can be a chip without electronic functions, dummy chip, which comprises a material such as silicon, and the bumps 284 have no signal transmission function. Moreover, the heat spreader 270 can be plated with gold 272 to improve the adhesion between the heat spreader 270 and the chip 230, and to improve the adhesion between the heat spreader 270 and the motherboard 300 (FIG. 3). In addition, the heat spreader also can be electrically connected to the ground contacts (not shown) of the chip 230 through ground bump, which is one of the bumps 284.

The chip 230 has an active surface 232 with contact pads 234, 236 and 238 disposed thereon, wherein the contact pads 234 surround the active surface 232 and the contact pads 236 and 238. The chip 230 is bonded to and electrically connected with the substrate 210 through bumps 280 that are disposed between the contact pads 234 of the chip 230 and the contact pads 216 of the substrate 210.

The heat spreader 270 is disposed on the active surface 232 of the chip 230 and disposed in the opening 214 of the substrate 210, and is bonded to the chip 230 through the bumps 284, each of which connects a contact 238 of the chip 230 and the heat spreader 270. The heat spreader 270 also can be a chip without electronic functions, dummy chip, which comprises a material such as silicon, and the bumps 284 have no signal transmission function. Moreover, the heat spreader 270 can be plated with gold 272 to improve the adhesion between the heat spreader 270 and the chip 230, and to improve the adhesion between the heat spreader 270 and the motherboard 300 (FIG. 3). In addition, the heat spreader also can be electrically connected to the ground contacts (not shown) of the chip 230 through ground bump, which is one of the bumps 284.

The heat spreader 270 is disposed on the active surface 232 of the chip 230 and disposed in the opening 214 of the substrate 210, and is bonded to the chip 230 through the bumps 284, each of which connects a contact 238 of the chip 230 and the heat spreader 270. The heat spreader 270 also can be a chip without electronic functions, dummy chip, which comprises a material such as silicon, and the bumps 284 have no signal transmission function. Moreover, the heat spreader 270 can be plated with gold to improve the adhesion between the heat spreader 270 and the chip 230, and to improve the adhesion between the heat spreader 270 and the motherboard 300 (FIG. 3). In addition, the heat spreader also can be electrically connected to the ground contacts (not shown) of the chip 230 through ground bump, which is one of the bumps 284.

FIG. 3 illustrates an MCM package with a heat spreader mounted on a motherboard according to the first embodiment of this invention in a cross-sectional view. The MCM package 200 can be mounted on the motherboard 300 through solder balls 286 with a reflow step. The motherboard 300 has a surface 302 with contact pads 304, a chip bonding area 306 and a heat spreader bonding area 308 disposed thereon, wherein the contacts 304 are located around the chip bonding area 306 and the heat spreader bonding area 308. The solder balls 286 of the MCM package 200 are bonded to and electrically connected with the contact pads 304 of the motherboard 300. A thermally conductive material 312 is applied to the chip bonding area 306 between the chip 250 and the motherboard 300 for rapidly conducting heat from the chip 250 to the motherboard 300. In addition, a thermal conduction material 314 is applied to the heat spreader bonding area 308 between the heat spreader 270 and the motherboard 300 for rapidly conducting heat from the heat spreader 270 to the motherboard 300.

In the above-mentioned MCM package 200, for example, the chips 230 and 250 are a central processing unit (CPU) and a memory chip, respectively. As the chip 230 is operated under high frequency and generates lots of heat because of dielectric loss, the heat can be rapidly conducted to the environment through the bumps 284, the heat spreader 270 and the thermally conductive material 314, as well as through the bumps 282, the chip 250 and the thermally conductive material 312. Therefore, the MCM package 200 of this invention is quite efficient in heat dissipation.

Figure 4:
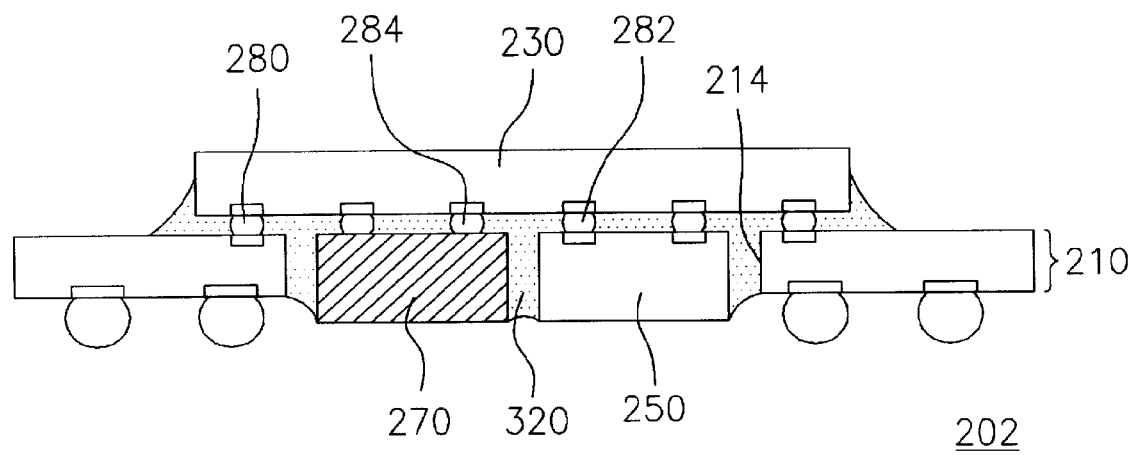
FIG. 4 illustrates a cross-sectional view of an MCM package with a heat spreader according to a second embodiment of this invention.

Nevertheless, this invention is not restricted to apply to the aforementioned cases. FIG. 4 illustrates a cross-sectional view of an MCM package with a heat spreader according to the second embodiment of this invention. The constituents having been mentioned in the first embodiment are labeled with the same reference numbers, and the descriptions thereof are omitted here. In this embodiment, the MCM package 202 further includes a filling material 320 that is filled into the opening 214 of the substrate 210 and between the two chips 230 and 250, between the chip 230 and the heat spreader 270 and between the chip 230 and the substrate 210 using a method such as a dispensing method. The filling material 320 is for encapsulating the chip 250, the heat spreader 270 and the bumps 280, 282 and 284.

Figure 5:
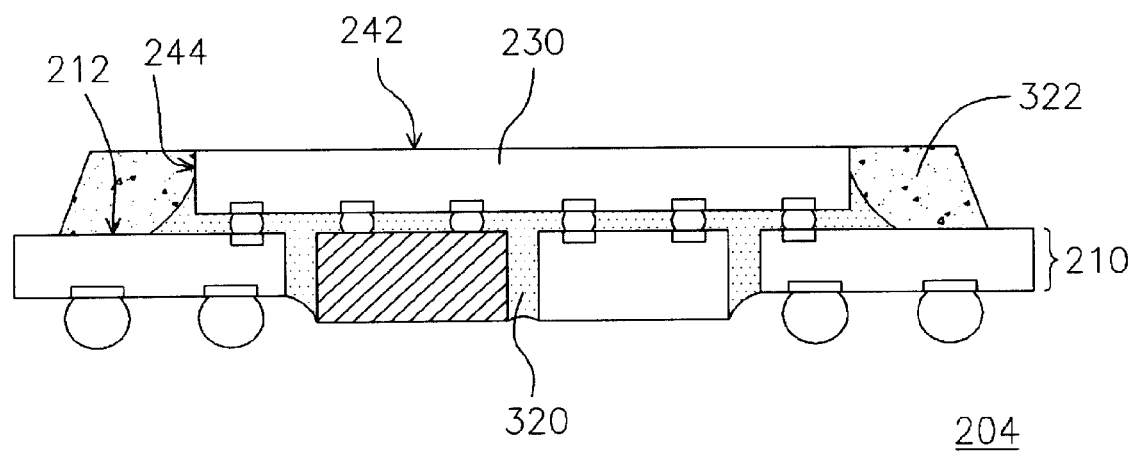
FIG. 5 illustrates a cross-sectional of an MCM package with a heat spreader according to a third embodiment of this invention.

FIG. 5 illustrates a cross-sectional view of a MCM package with a heat spreader according to the third embodiment of this invention. The constituents that have been mentioned in the first and the second embodiments are labeled with the same reference numbers, and the descriptions thereof are omitted here. In this embodiment, the MCM package 204 further includes a molding material 322, which may be filled into a mold cavity (not shown) of a mold (not shown) to encapsulate the upper surface 212 of the substrate 210 and the sidewalls 244 of the filling material 320 and the chip 230. The back surface 242 of the chip 230 is adhered to a surface of the mold cavity, so that the back surface 242 is exposed after the mold is released.

Figure 6:
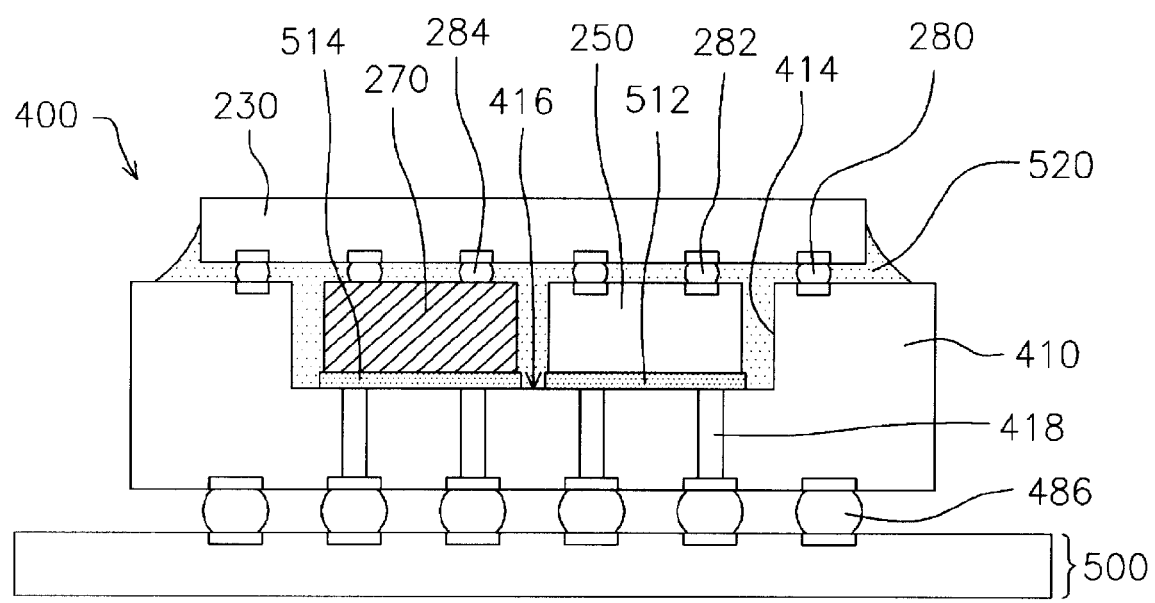
FIG. 6 illustrates an MCM package with a heat spreader mounted on a motherboard according to a fourth embodiment of this invention in a cross-sectional view.

Though the opening passes through the substrate in the embodiments described above, the corresponding structure of this invention is not restricted thereto. FIG. 6 illustrates an MCM package with a heat spreader mounted on a motherboard according to the fourth embodiment of this invention in a cross-sectional view. The constituents having been mentioned in the first embodiments are labeled with the same reference numbers, and the descriptions thereof are omitted here. Referring to FIG. 6, the substrate 410 has a cavity 414 thereon with a bottom surface 416, and many thermo-vias 418 passing through the substrate 410. One end of each thermo-via 418 is exposed at the bottom surface 416 of the cavity 414 on the substrate 410, and the other end is connected with a solder ball 486, while the substrate 410 is bonded to the motherboard 500 through the solder balls 486. A thermally conductive material 512 is applied between the chip 250 and the bottom surface 416 of the cavity 414, so that heat can be rapidly conducted from the chip 250 to the substrate 410, and then from the substrate 410 to the motherboard 500 through the thermo-vias 418 and the solder balls 486. In addition, a thermally conductive material 514 is applied between the heat spreader 270 and the bottom surface 416 of the substrate 410, so that heat can be rapidly conducted from the heat spreader 270 to the substrate 410, and then from the substrate 410 to the motherboard 500 through the thermo-vias 418 and the solder balls 486. Besides, the heat spreader 270 also can be electrically connected to the ground contacts (not shown) of the chip 230 through ground bump, which is one of the bumps 284. Furthermore, the substrate further comprises a ground-vias and the heat spreader is electrically connected to the ground-vias. The MCM package 400 further comprises a filling material 520 that is filled into the cavity 414 on the substrate 410 and between the two chips 230 and 250, between the chip 230 and the heat spreader 270 and between the chip 230 and the substrate 410 using a method such as a dispensing method. The filling material 520 is for encapsulating the chip 250, the heat spreader 270 and the bumps 280, 282 and 284.

Figure 7:
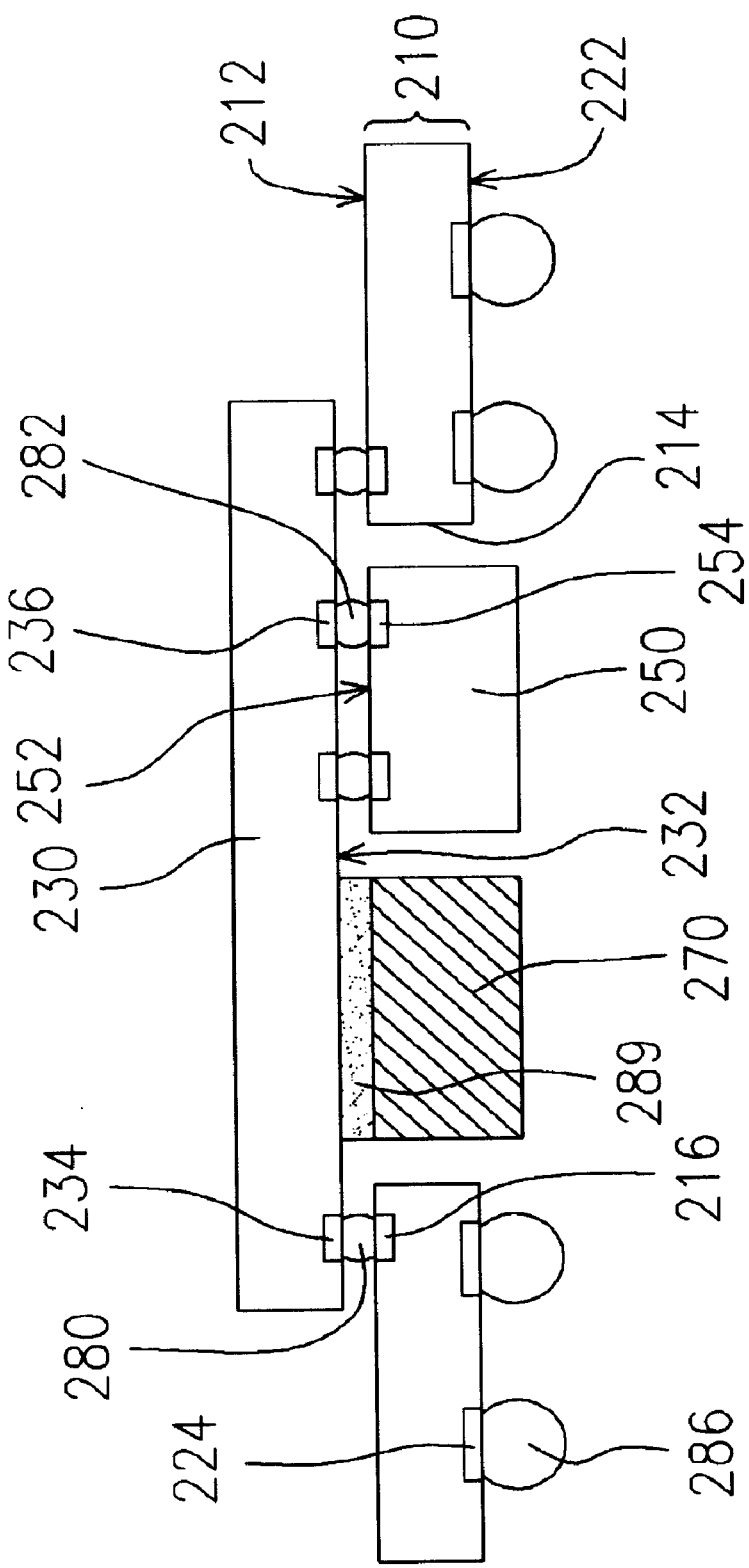
FIG. 7 illustrates a cross-sectional view of an MCM package with a heat spreader according to a fifth embodiment of this invention.

Moreover, though the first chip is bonded with the heat spreader through bumps, this invention is not restricted to adopt such a design. As shown in FIG. 7, which illustrates a cross-sectional view of an MCM package with a heat spreader according to the fifth embodiment of this invention, the first chip 230 may be bonded with the heat spreader 270 with a thermally conductive adhesive 289. The other constituents that have been mentioned in the first embodiment are labeled with the same reference numbers, and the descriptions thereof are omitted here.

Furthermore, the first chip is not restricted to bond with only one second chip or only one heat spreader, and can be bonded with multi second chips or multi heat spreaders.

As mentioned above, in the MCM package with a heat spreader of this invention, the active surface of the first chip is disposed with a heat spreader in addition to a second chip. Therefore, the heat generated from the first chip can be rapidly conducted to the environment, and heat dissipation of the MCM package is highly efficient.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

The invention claimed is:

1. A multi-chip module (MCM) package, comprising:
a substrate having an opening therein;
a plurality of first bumps;
a first chip that has an active surface bonded to and electrically connected with the substrate through the first bumps, the active surface of the first chip facing the opening of the substrate;
a plurality of second bumps;
at least one second chip disposed in the opening of the substrate and bonded to the active surface of the first chip through the second bumps, the second chip being electrically connected to the first chip through the second bumps; and
at least one heat spreader disposed in the opening of the substrate and bonded to the active surface of the first chip, the heat spreader comprising a dummy chip.

2. The MCM package of claim 1, further comprising a filling material in the opening of the substrate, between the first chip and the second chip and between the first chip and the substrate, the filling material encapsulating the first bumps and the second bumps.

3. The MCM package of claim 1, wherein the surface of the heat spreader is plated with gold.

4. The MCM package of claim 1, further comprising a plurality of third bumps for bonding the heat spreader to the active surface of the first chip.

5. The MCM package of claim 1, further comprising a thermally conductive adhesive for bonding the heat spreader to the active surface of the first chip.

6. The MCM package of claim 1, wherein the first chip further comprises a ground contact and the second bumps comprises a ground bump.

7. The MCM package of claim 6, wherein the heat spreader is electrically connected to the ground contact through the ground bump.

8. A multi-chip module (MCM) package, comprising:
a substrate having a hole therein;
a plurality of first bumps;
a first chip that has an active surface bonded to and electrically connected with the substrate through the first bumps, the active surface of the first chip facing the hale of the substrate;
a plurality of second bumps;
at least one second chip disposed in the hole of the substrate and bonded to the active surface of the first chip through the second bumps, the second chip being electrically connected to the first chip through the second bumps; and
at least one heat spreader disposed in the hole of the substrate and bonded to the active surface of the first chip, the heat spreader comprising a dummy chip.

* * * * *